US011786858B2

(12) United States Patent
Mahawili (10) Patent No.: US 11,786,858 B2
(45) Date of Patent: Oct. 17, 2023

(54) LIQUID FILTER APPARATUS FOR GAS/SOLID SEPARATION FOR SEMICONDUCTOR PROCESSES

(71) Applicant: EDWARDS VACUUM LLC, Sanborn, NY (US)

(72) Inventor: Imad Mahawili, Roseville, CA (US)

(73) Assignee: Edwards Vacuum LLC, Sanborn, NY (US)

( * ) Notice: Subject to any disclaimer, the term of this patent is extended or adjusted under 35 U.S.C. 154(b) by 385 days.

(21) Appl. No.: 16/893,504

(22) Filed: Jun. 5, 2020

(65) Prior Publication Data

US 2020/0384403 A1    Dec. 10, 2020

Related U.S. Application Data

(60) Provisional application No. 62/857,862, filed on Jun. 6, 2019.

(51) Int. Cl.
*B01D 47/02* (2006.01)
*C23C 14/44* (2006.01)
*C23C 16/44* (2006.01)
*G03F 7/00* (2006.01)

(52) U.S. Cl.
CPC ......... *B01D 47/021* (2013.01); *B01D 47/024* (2013.01); *B01D 47/025* (2013.01); *C23C 16/4412* (2013.01); *G03F 7/70916* (2013.01)

(58) Field of Classification Search
CPC .... B01D 47/02; B01D 47/021; B01D 47/024; B01D 47/025; B01D 50/40; B01D 45/02; B01D 2247/04; B01D 47/022; C23C 16/4412; C23C 16/4402; F23J 2219/40
See application file for complete search history.

(56) References Cited

U.S. PATENT DOCUMENTS

| | | | |
|---|---|---|---|
| 4,211,249 A | 7/1980 | Richards | |
| 5,427,610 A | 6/1995 | Croker | |
| 5,616,208 A | 4/1997 | Lee | |
| 5,759,237 A | 6/1998 | Li et al. | |

(Continued)

FOREIGN PATENT DOCUMENTS

| CN | 2633410 Y | 8/2004 | |
|---|---|---|---|
| CN | 104771979 A * | 7/2015 | ........... B01D 47/021 |

(Continued)

OTHER PUBLICATIONS

KR101489119B1_ENG (Kipris machine translation of Jee) (Year: 2015).*

(Continued)

*Primary Examiner* — Gabriel E Gitman
(74) *Attorney, Agent, or Firm* — Gardner, Linn, Burkhart & Ondersma (57) ABSTRACT

A liquid filter apparatus for gas/solid separation includes a housing with a filter chamber, a semiconductor process gas inlet, and a process gas outlet. The filter chamber forms a liquid reservoir, and the semiconductor process gas inlet and the process gas outlet are in communication with the filter chamber. The housing further includes a filter liquid inlet and a filter liquid outlet, which are in communication with the liquid reservoir for delivering and removing filter fluid, respectively, to and from the liquid reservoir.

14 Claims, 11 Drawing Sheets

(56) References Cited

U.S. PATENT DOCUMENTS

| | | | |
|---|---|---|---|
| 6,039,060 A | 3/2000 | Rower | |
| 6,325,361 B1 | 12/2001 | Van Duijn | |
| 6,370,911 B1 | 4/2002 | Zhou et al. | |
| 6,391,100 B1 * | 5/2002 | Hogan | B01D 45/12 |
| | | | 261/DIG. 54 |
| 6,673,323 B1 | 1/2004 | Bhatnagar et al. | |
| 10,302,553 B2 | 5/2019 | Siladie et al. | |
| 10,685,818 B2 | 6/2020 | Dickinson | |
| 2001/0024887 A1 | 9/2001 | Graves et al. | |
| 2001/0048902 A1 | 12/2001 | Hertzler et al. | |
| 2002/0192129 A1 * | 12/2002 | Shamouilian | B01D 53/8659 |
| | | | 422/177 |
| 2006/0107838 A1 | 5/2006 | Meier et al. | |
| 2008/0276801 A1 | 11/2008 | Bell et al. | |
| 2010/0071548 A1 | 3/2010 | Smith | |
| 2010/0155222 A1 | 6/2010 | Rostaing et al. | |
| 2011/0135552 A1 | 6/2011 | Dickinson et al. | |
| 2016/0166868 A1 | 6/2016 | Dickinson | |
| 2016/0236379 A1 * | 8/2016 | Rolland | B32B 3/30 |
| 2018/0221806 A1 * | 8/2018 | Fang | B01D 47/021 |
| 2019/0282948 A1 | 9/2019 | Mahawili | |
| 2020/0291524 A1 | 9/2020 | Zong | |

FOREIGN PATENT DOCUMENTS

| | | | | |
|---|---|---|---|---|
| CN | 108619866 A | * | 10/2018 | B01D 29/03 |
| DE | 3712007 A1 | * | 10/1988 | B01D 47/021 |
| DE | 102009040997 A1 | * | 4/2011 | C23C 14/243 |
| GB | 2135208 A | * | 8/1984 | B01D 47/021 |
| KR | 20090056353 A | | 6/2009 | |
| KR | 20100126167 A | | 12/2010 | |
| KR | 101489119 B1 | * | 2/2015 | B01D 47/02 |
| TW | 201125632 A | | 8/2011 | |
| WO | WO-2013103198 A1 | * | 7/2013 | B01D 46/42 |
| WO | 2017132186 A1 | | 8/2017 | |
| WO | 2018080885 A1 | | 5/2018 | |

OTHER PUBLICATIONS

DE102009040997A1_ENG (Espacenet machine translation of Huber) (Year: 2011).*

CN104771979A_ENG (Espacenet machine translation of Chen) (Year: 2015).*

KR101489119B1_ENG (Espacenet machine translation of Jee) (Year: 2015).*

WO2013103198A1_ENG (IP.com machine translation of Lee) (Year: 2013).*

DE3712007A1_ENG (Espacenet machine translation of Kroll) (Year: 1988).*

CN108619866A_ENG (Espacenet machine translation of Yang) (Year: 2018).*

PCT International Search Report regarding PCT/US2020/36245, dated Sep. 9, 2020.

PCT Written Opinion of the International Searching Authority regarding PCT/US2020/36245, dated Sep. 9, 2020.

International Search Report and Written Opinion of the International Searching Authority of International Application No. PCT/US2021/050775 dated Dec. 10, 2021.

International Search Report of International Application No. PCT/US2017/014815 completed May 8, 2017.

Written Opinion of the International Searching Authority of International Application No. PCT/US2017/014815 dated May 8, 2017.

* cited by examiner

LIQUID FILTER APPARATUS FOR GAS/SOLID SEPARATION FOR SEMICONDUCTOR PROCESSES

This application claims the benefit of U.S. Prov. App. Ser. No. 62/857,862, which was filed on Jun. 6, 2020 and which is hereby incorporated by reference in its entirety.

TECHNICAL FIELD AND BACKGROUND OF THE INVENTION

In general, the fabrication of semiconductor devices employs the conversion via oxidation, for example, at modest to highly elevated silicon wafer temperatures of certain chemicals to form the desired thin films that make up the circuit layers of semiconductor devices. For example, in a chemical vapor deposition (CVD) process silicon dioxide thin film deposited on a silicon wafer is formed by the oxidation of silane with oxygen at a wafer temperature of approximately 400 degrees centigrade and at processing chamber pressure of around 300 mTorr. Silicon dioxide thin films are also deposited by the oxidation of vapor tetraethysiloxane, TOES, with oxygen and ozone at nearly similar processing conditions. Silicon oxide films are also deposited at lower temperatures using low-pressure gas phase plasma enhancement (PECVD). In another process, silane is reacted with ammonia to form silicon nitride at low pressures and moderate wafer temperatures. In these and nearly all other CVD reactions, such as the formation of tungsten and tungsten silicide thin films, nearly 75% of the gaseous feed reactants into the processing chamber pass through the process chamber unconverted.

Figure 1:
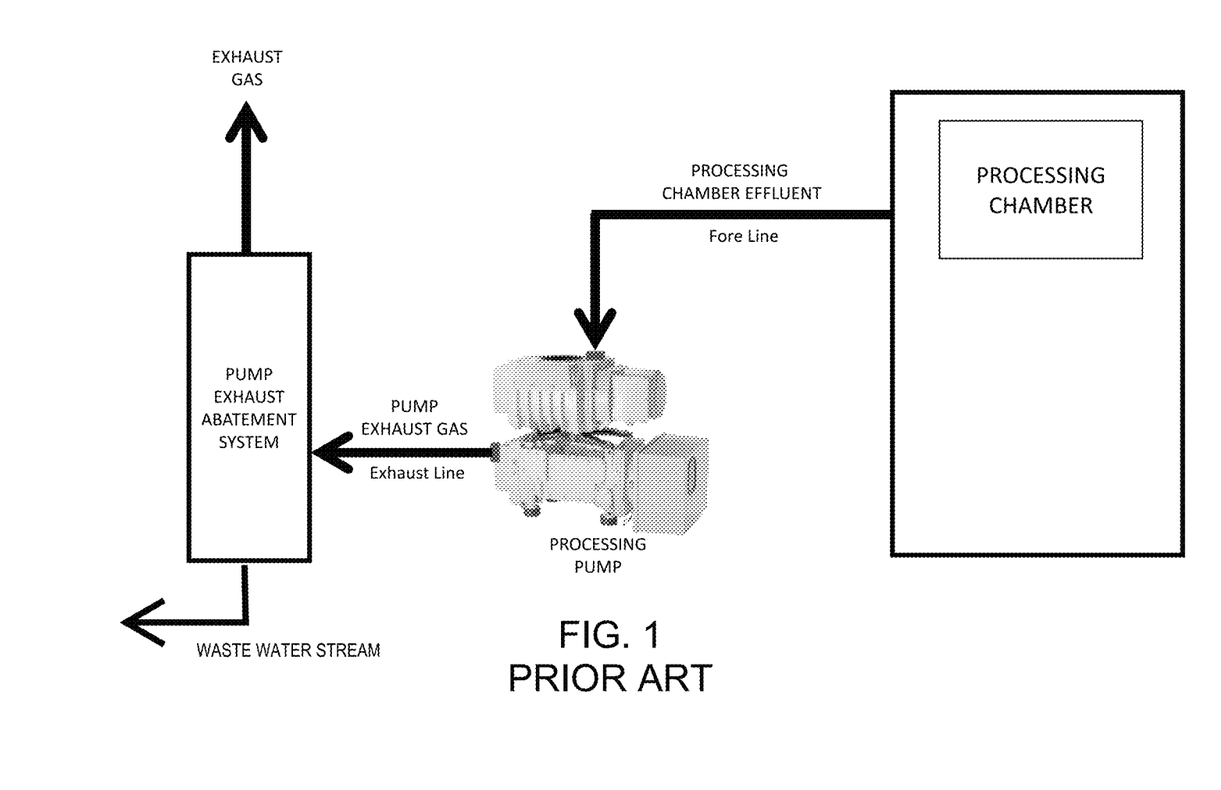
FIG. 1 is a schematic drawing of a prior art CVD or PECVD system that consists of processing chamber connected via a fore-line to a vacuum pump.

The exhaust of a typical semiconductor processing chamber is a gaseous stream that is at low pressure and consists of unconverted feed reactants, reaction byproducts, diluent nitrogen carrier gas and particles. These particles are a byproducts of gas phase reactions of the heated reactants in the gas phase, which continue to form and grow in quantity along the fore-line that spans the distance between the processing chamber and the vacuum pump, which could be up to 60 feet in typical fabrication facilities. FIG. 1 is a schematic diagram of a typical CVD or PECVD system that consists of processing chamber connected via a fore-line to a vacuum pump. The vacuum pump is connected via an exhaust line to a typical gas exhaust abatement system that uses natural gas flame to destroy the unreacted process gases followed by a gas/water absorption column to remove acidic gaseous byproducts. The outputs of such abatement systems consist of an acidic waste water stream that normally is neutralized and discharged and a gas stream that is laden with fine particles that are emitted to the atmosphere after passing through large surface area mechanical particle filters.

Particles coat all the connection lines between the processing chamber, the vacuum pumps and the abatement systems and often fill up and plug these lines causing significant maintenance down times at significant added cost of operations. In many cases, the vacuum pumps have to be shut down due to high particle depositions rendering them inoperative. Routinely vacuum pumps are removed and replaced from such lines at extremely high material and labor costs. In few processes, mechanical filters are placed in the vacuum fore-lines trapping these particles to extend the life time of the vacuum pumps. In many cases both the fore-lines and the pump exhaust lines are heated to prevent the condensation of unconverted condensable reactants, which subsequently help to absorb and agglomerate gas-laden particles and create a liquid/solid plugs that are very challenging and costly to clean.

Particles separation from gas-laden particle streams is best achieved using a liquid medium. For example, particles can be separated from large gas flow rates by passing the gas-laden particle stream through a very high flow rate water shower. High particle separation into the water stream can be achieved by proper sizing of the vessel volume and water flow rate. While such separation processes are effective and economical using water they cannot be used in semiconductor processing due to potential adverse water chemical reactions with the reactants in the gas stream and the very high water vapor pressure in low pressure fore-line. In vacuum CVD and PECVD semiconductor processes molecular water present in the fore-line would diffuse backward to the processing chamber itself and degrades the chemical composition of the semiconductor thin films being processed.

SUMMARY

Accordingly, a liquid filter apparatus is provided that uses a liquid as a medium to separate particles from gas-laden particle streams in low pressure fore-line in CVD and PECVD semiconductor processes. Suitable filter liquids have a vapor pressure below approximately $10^{-7}$ Torr, such as the commercially available Fomblin liquid with its chemical name of perfluoropolyethers (PFPE), which have vapor pressures of approximately $6 \times 10^{-8}$ Torr or below. These suitable liquids, such as PFPE, are chemically inert and can be used in temperatures ranging from −58 degrees centigrade and up to 257 degrees centigrade and have negligible outgassing under high vacuum operation. They are electrically non-conductive with a dielectric strength of approximately 15.7 MV/m. They can be formulated with kinematic viscosities, for example, ranging from 38 to 1830 cSt. For reference, water has a kinematic viscosity of 1 cSt.

In one embodiment, a liquid filter apparatus for gas/solid separation includes a housing with a filter chamber, a semiconductor process gas inlet, and a process gas outlet. The chamber forms a liquid reservoir, and the semiconductor process gas inlet and the process gas outlet are in communication with the filter chamber. The housing further includes a filter liquid inlet and a filter liquid outlet, which are in communication with the liquid reservoir for delivering and removing filter fluid, respectively, to and from the liquid reservoir.

In one aspect, the semiconductor process gas inlet is in line with the process gas outlet. For example, the housing may include a gas exhaust chamber between the liquid reservoir and the process gas outlet wherein the filtered process gas can be exhausted before exiting the housing through the process gas outlet.

In another aspect, the liquid filter apparatus further includes a feed tube that is in communication with the process gas inlet and extends into the filter liquid in the liquid reservoir to directly inject the process gas flowing through the process gas inlet into the filter liquid in the liquid reservoir.

For example, when the housing has a gas exhaust chamber between the liquid reservoir and the process gas outlet, the housing may include an internal conduit in liquid communication with the filter chamber and the gas exhaust chamber to direct the flow of filtered process gas from the filter chamber to the gas exhaust chamber.

In another aspect, the feed tube comprises a perforated feed tube. For example, the perforated feed tube may include a plurality of perforations at its distal end portion.

In a further aspect, in any of the above apparatuses, the liquid filter apparatus further includes a filter liquid control system for controlling the filter liquid flow into and out of the liquid reservoir. For example, the filter liquid control system may include a controller and a fluid circuit, with the controller controlling the fluid circuit to regulate the flow of filter liquid into and out of the liquid reservoir and which is configured to maintain the filter liquid at a liquid height in the liquid reservoir.

In another aspect, the liquid filter apparatus includes a feed tube with a venturi restriction therein and a venturi inlet in fluid communication with the semiconductor process gas inlet or the liquid filter inlet to draw in the process gas or the filter liquid into the feed tube.

In a further aspect, the liquid filter apparatus further includes a filter liquid control system for controlling the filter liquid flow into and out of the liquid reservoir, with the filter liquid control system including a controller and a fluid circuit, wherein the controller controls the fluid circuit to regulate the flow of filter liquid into and out of the liquid reservoir and configured to maintain the filter liquid at a liquid height in the liquid reservoir.

In one aspect, the filter liquid control system includes a pump in fluid communication with the filter liquid inlet to pump filter liquid into the liquid reservoir. In a further aspect, the filter liquid inlet being in fluid communication with the liquid reservoir through the feed tube wherein the pump is configured to circulate the filter liquid into the liquid reservoir through the feed tube.

In other aspects, the housing includes one or more optical windows for viewing the chamber.

According to yet another embodiment, a method of separating solids from a semiconductor process gas includes the steps of directing the semiconductor process gas into a filter liquid stream or a reservoir containing a filter liquid to thereby filter the process gas, and exhausting the filtered process gas.

In one aspect, the step of directing includes bubbling the semiconductor process gas into the filter liquid in the reservoir.

In another aspect, the filter liquid is circulated through the reservoir to thereby remove the particle filled filter fluid.

According to yet another aspect, the method include forming a venturi stream with the filter fluid, and using the venturi stream to draw in the semiconductor process gas into the filter liquid stream.

DETAILED DESCRIPTION OF THE DRAWINGS

DETAILED DESCRIPTION

Figure 2:
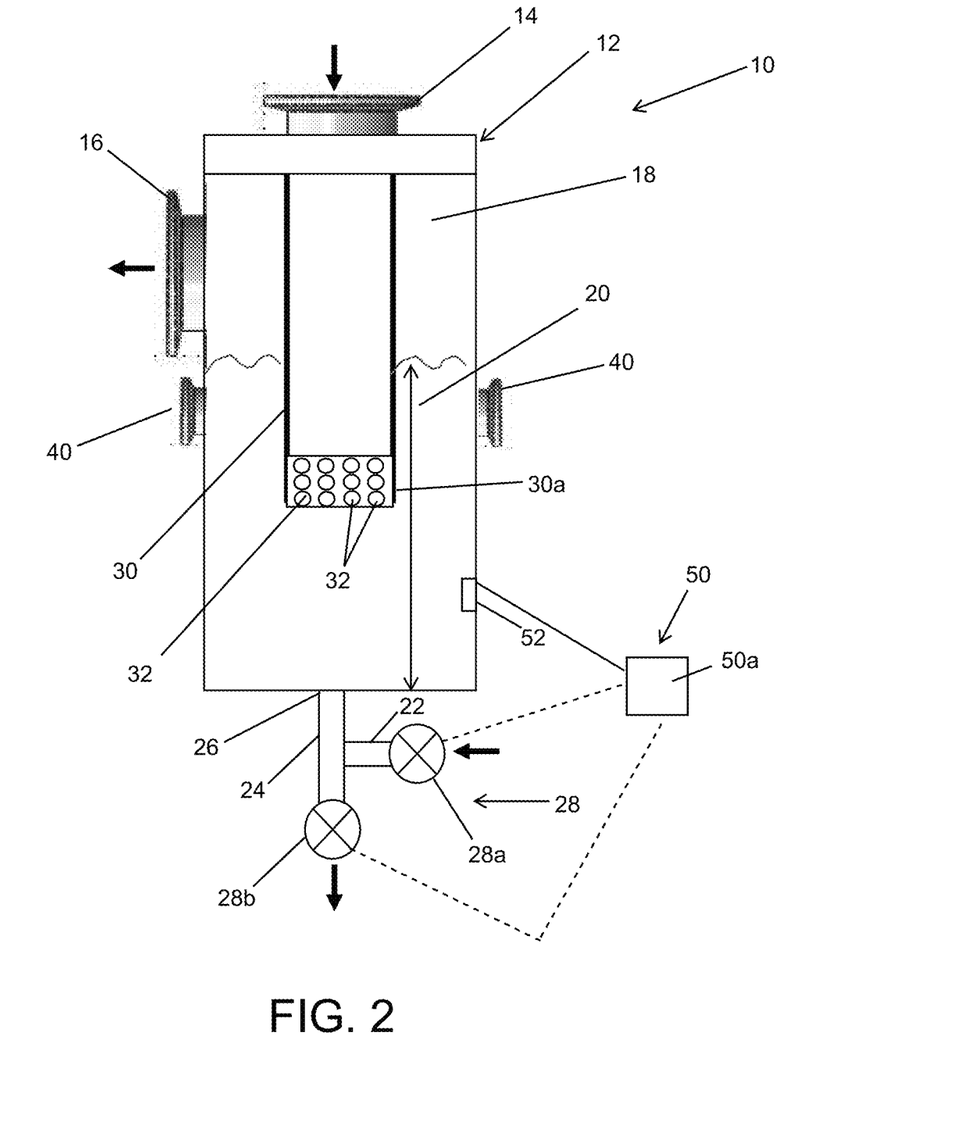
FIG. 2 is a schematic drawing of a first embodiment of a liquid filter apparatus for separating solid from a semiconductor process gas.

Referring to FIG. 2, the numeral 10 generally designates a liquid filter apparatus that can be placed in the fore-line with a semiconductor process chamber exhaust and is configured to filter solids or particles from the semiconductor process gas, which is exhausted from the semiconductor process chamber and typically laden with solids or particles as a byproduct of gas phase reactions during the semiconductor process. The filter apparatus 10 includes a housing 12 with a process gas inlet 14 for receiving the semiconductor process gas inflow from a semiconductor processing chamber, which is typically laden with solids or particles, and a gas outlet 16 which discharges the filtered process gas after the filtering process described below.

Housing 12 is formed form an inert material, such as aluminum, quartz, polymers and typically a stainless steel alloy and includes a filter chamber 18 that receives the process gas from a semiconductor processing chamber through inlet 14 and from which filtered gas is discharged through outlet 16. Filter chamber 18 forms a liquid reservoir 20 to hold a filter liquid that filters solids or particles from the process gas flowing into the filter apparatus. It has been found that suitable filter liquids to remove or filter out solids or particles from semiconductor process gases but which do not create chemical reactions with the reactants in the process gas stream include liquids with a vapor pressure below approximately $10^{-7}$ Torr and that are chemically inert. Suitable liquids include liquids that can be used in temperatures ranging from −58 degrees centigrade and up to +257 degrees centigrade and that have negligible outgassing. Suitable liquids include liquids that are electrically non-conductive with a dielectric strength of in a range of 15.7 MV/m. In addition, suitable liquids have kinematic viscosities greater than water (for reference, water has a kinematic viscosity of 1 cSt), for example, kinematic viscosities ranging from 38 to 1830 cSt. For example, suitable liquids include the commercially available Fomblin liquid, or perfluoropolyethers (PFPE). PFPEs have a vapor pressures of approximately $6 \times 10^{-8}$ Torr or below, and are chemically inert. PFPEs can be used in temperatures ranging from −58 degrees centigrade and up to +257 degrees centigrade and have negligible outgassing. PFPEs have a dielectric strength of approximately 15.7 MV/m, are chemically inert, and can be used in temperatures ranging from −58 degrees centigrade and up to +257 degrees centigrade and have negligible outgassing. They can be formulated with kinematic viscosities, for example, ranging from 38 to 1830 cSt. However, PFPE are expensive liquids and thus the particle-laden PFPE liquids withdrawn may be sent to commercial purifiers and recycled.

As will be more fully described below, the level of the liquid in the liquid reservoir 20 may be maintained by a control system to assure immersion of the process gas in the filter liquid, as described more fully below. For example, the height of the liquid in reservoir 20 may fall in a range of 3 inches to 8 inches, or 1 inch to 3 inches, or typically 2 inches to 6 inches depending on the configuration of the filter apparatus. The filter size and PFPE volume hold up varies depending on the specific semiconductor process and chemistry.

The filter liquid is delivered to and discharged from liquid reservoir 20 through a filter liquid inlet 22 and a filter liquid outlet 24, which are in communication with the liquid reservoir through conduits, such as tubing, that couple to a common port 26 on housing 12 for delivering and removing filter fluid to and from the liquid reservoir, respectively. Further, as will be more fully described below, in one embodiment, the filter liquid may be circulated through the apparatus 10 to increase the interaction between the filter liquid and the process gas.

Referring again to FIG. 2, apparatus 10 further includes a feed tube 30, which is in communication with the process gas inlet 14 and extends into the filter liquid in the liquid reservoir 20 to directly inject the process gas flowing through the process gas inlet into the filter liquid in the liquid reservoir.

Feed tube 30 is formed from an inert material, such as aluminum, quartz, polymers and typically a stainless steel alloy and optionally includes a plurality of perforations 32 at its distal end portion 30a, with its distal end being closed to direct all the flow of the process gas through the perforations, which generate a bubbling effect with the process gas in the liter fluid. The size and number and locations of the perforations may vary, but may fall in a range of 0.125 inch in diameter to 0.5 inch or larger, or about 0.25 inch diameter. The purpose of the holes is to efficiently disperse the particle-laden gas stream and intimately mix it with the filter liquid. The gas bubbles created by the gas flowing from the perforations mixes with the filter liquid, and the particles are separated from the gas stream and adsorbed into the filter liquid without imparting any harmful back-streaming to the semiconductor processing chamber.

As noted above, the liquid filter apparatus 10 may include a filter liquid control system 50 for controlling the filter liquid flow into and out of the liquid reservoir 20. For example, the filter liquid control system 50 may include a controller 50a, such as a microprocessor, and a fluid circuit 28, with the controller 50a controlling the fluid circuit via electrically controlled valves 28a, 28b and a pump (not shown, such as a centrifugal or magnetically couple pump), to regulate the flow of filter liquid thorough inlet 22 and outlet 24 and into and out of the liquid reservoir 20. Filter liquid control system 50 may also be configured to maintain the filter liquid at a liquid height in the liquid reservoir, as noted above. In this manner, the filter liquid may be exchanged with new filter liquid when the liquid is "spent" meaning that it has reached a certain level of absorption. For example, when the filter liquid is empirically deemed saturated with particles, it may be desirable to circulate fresh filter liquid in to the reservoir or it may be desirable to circulate the fluid regardless of how much it has absorbed of the particles.

In one embodiment, the control system 50 includes one or more sensors 52. Sensors 52 may be used to detect the level of the filter liquid or measure the opacity or other characteristic of the liquid, which may be used to indicate that the liquid has reached a certain level of particle absorption. For example, determining when the liquid has reached a certain level of particle absorption may be based on another characteristic of the liquid, such as the viscosity. Or both types of sensors may be used—one measuring the filter liquid height and the other measuring the characteristic of the liquid to indicate when the liquid has reached a desired level of particle absorption. In either or both cases, the control system 50 may be used to adjust the flow of filter fluid into and out of liquid reservoir 20 based on the one or more sensors to accommodate the output of the semiconductor chamber and/or to optimize the filtering process.

Optionally, apparatus 10 may include one or more optical windows 40 for viewing the chamber 18. For example, the widows or window 40 may be formed from pyrex or a quartz material and extend into and through the wall of housing 12. Windows may be located beneath the desired filter liquid height so that the liquid can be observed manually for its height and/or opacity or other characteristic to offer manual control over the filter apparatus if desired. Windows 40 may comprise manual or automated optical windows and can be used to assess empirically the entrained solid content within the filter liquid and trigger a manual or automatic withdrawal of certain liquid volume and the addition of fresh filter liquid via valve 28a, 28b for continuous dynamic filter operation without the interruption of the process chamber or production. For example, the valving (e.g. valves 28a, 28b) noted above may provide manual control, including manual override control, over the electrically operated valves so that an operator may manually control apparatus 10.

In the illustrated embodiment, process gas inlet 14 and gas outlet 16 are located at the top and side of housing 12 so that they have a generally ninety degree (right angle) orientation; however, as will be described in reference to the second embodiment, the gas inlet 14 and gas outlet 16 may be rearranged so that they are generally in-line.

In operation, the process gas flow enters at the top of apparatus 10, as shown, and goes through feed tube 30, bubbles through the filter liquid in reservoir 20, where it sheds off its particles and leaves the filter liquid reservoir 20. The filtered gas then exits apparatus 10 at the side through gas outlet 16.

Figure 3:
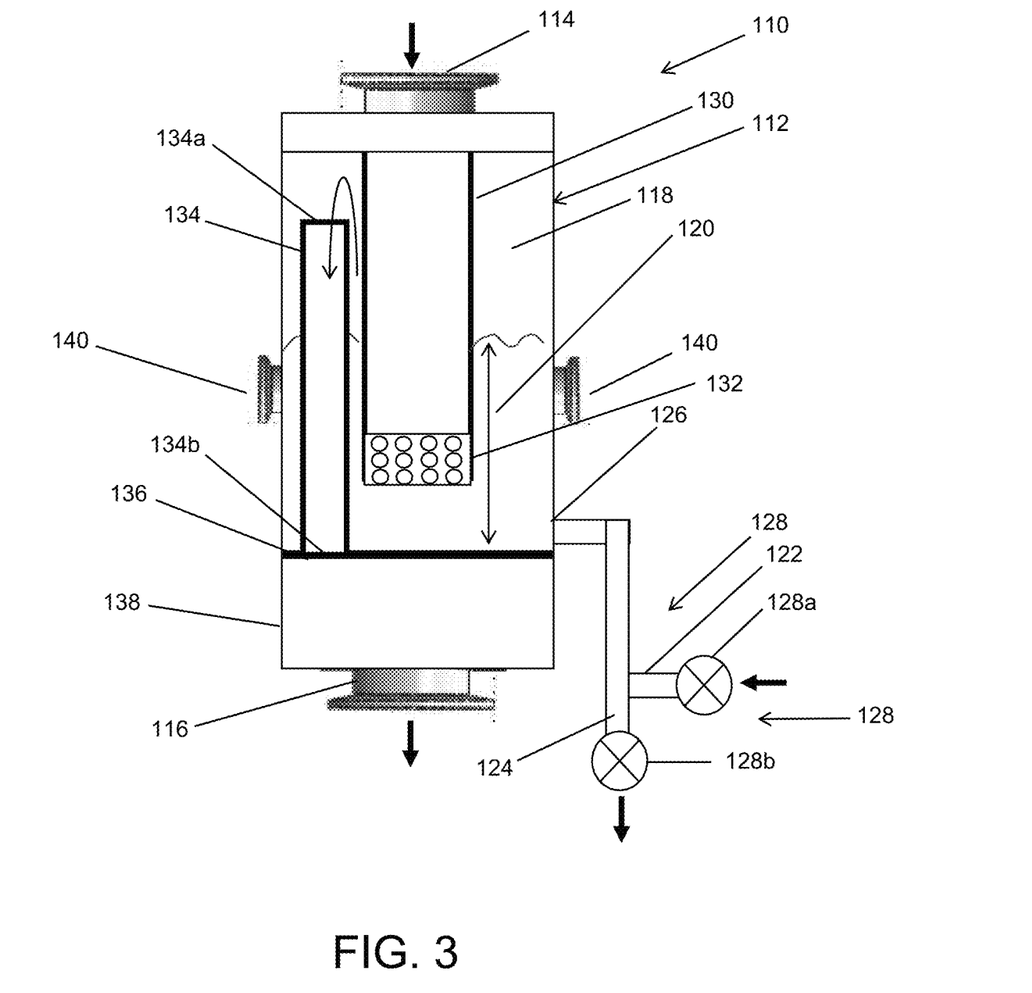
FIG. 3 is a schematic drawing of a second embodiment of a liquid filter apparatus for separating solid from a semiconductor process gas.

Referring to FIG. 3, the numeral 110 generally designates another or second embodiment of a liquid filter apparatus that can be placed in the fore-line with a semiconductor process chamber exhaust and is configured to filter solids or particles from the semiconductor process gas, which is exhausted from the semiconductor process chamber. Similar to the previous embodiment, filter apparatus 110 includes a housing 112 with a process gas inlet 114 for receiving the semiconductor process gas inflow from a semiconductor processing chamber, which is typically laden with solids or particles, and a gas outlet 116, which discharges the filtered process gas after the filtering process described below. For details of the suitable materials for the housing construction reference is made to the first embodiment.

As best seen in FIG. 3, housing 112 also includes a filter chamber 118 that receives the process gas through process gas inlet 114 and from which the filtered gas is discharged through gas outlet 116. Filter chamber 118 forms a liquid reservoir 120 to hold a filter liquid that filters solids or particles from the process gas flowing into the filter apparatus. For examples of suitable liquid characteristics and suitable liquids that can filter solids or particles from semiconductor process gases, reference is made to the first embodiment.

In the illustrated embodiment, process gas inlet 114 and gas outlet 116 are generally in-line. To that end, housing 120 includes an exhaust chamber 138 between liquid reservoir 120 and gas outlet 116 to allow the filter gas to be exhausted from the filter chamber internally prior to being discharged through gas outlet 116. In-line filter apparatuses may be used in certain locations where the right-angle filter apparatus of the first embodiment may not fit the existing fore-line geometry.

To form exhaust chamber 138, housing 112 includes a solid plate 136 that divides the internal space in housing 112 between filter chamber 118 and exhaust chamber 138 and, further, includes an internal conduit 134. The internal conduit 134 includes a first open end 134a located above the height of the filter liquid and a second open end 134b, which is extended through plate 136 for discharge into exhaust chamber 138. Although illustrated as terminating at plate 136, it should be understood that internal conduit 134 may extend through the plate into the exhaust chamber 138. A suitable conduit includes a tube or tubing that is formed from an inert material, such as aluminum, quartz, polymers and typically a stainless steel alloy.

Similar to the previous embodiment, housing 110 includes a feed tube 130 that is in fluid communication with inlet 114 and extends into liquid reservoir 120 to inject the process gas into the filter fluid in a similar manner as described above. Further details of the tube 130 reference is made to feed tube 30.

Also similar to previous embodiment, the level of the liquid in the liquid reservoir 120 may be maintained by a control system to assure immersion of the process gas in the filter liquid, as described above.

Apparatus 110 operates in a similar manner to apparatus 10. Process gases flows into inlet 114 and is injected into the filter liquid in reservoir 120 via feed tube 130. Due to the presence of the perforations in the feed tube 130, the process gas is bubbled into the filter liquid, where the solids or particles are removed from the process gas as they are absorbed by the filter liquid. The filtered gas is then exhausted from the filter chamber 118 through internal conduit 134, which directs the filtered gas into exhaust chamber 138, which then discharges the filtered gas through gas outlet 116.

In a similar manner to the previous embodiment, the filter liquid may be circulated through the apparatus 110 via fluid circuit 128, which includes an inlet valve 128a (which is in fluid communication with liquid inlet 122) and an outlet valve 128, which in fluid communication with liquid inlet 124), and various conduits and a pump (not shown, such as a centrifugal or magnetically couple pump), to direct the flow of filter liquid to and from the liquid reservoir 120 through a common port 126, as noted above, to circulate the filter liquid or simply replace the filter liquid.

Apparatus 110 may also include optical windows 140 for viewing the chamber 118. For example, the widows or window 140 extend into and through the wall of housing 112 and may be located beneath the desired filter liquid height so that the liquid can be observed manually for its height and/or opacity or other characteristic to offer manual control over the filter apparatus if desired.

As stated above, in operation, the particle-laden process gas flow enters at the top of apparatus 110, as shown, and goes through the internal feed tube 130, bubbles through the filter in reservoir 120, and enters the internal conduit 134 after it is filtered and sheds off its particles and leaves the filter liquid reservoir 120. The filtered gas then enters exhaust chamber 138 and exits apparatus 110 at the bottom and in in-line with the top process gas input.

Figure 4:
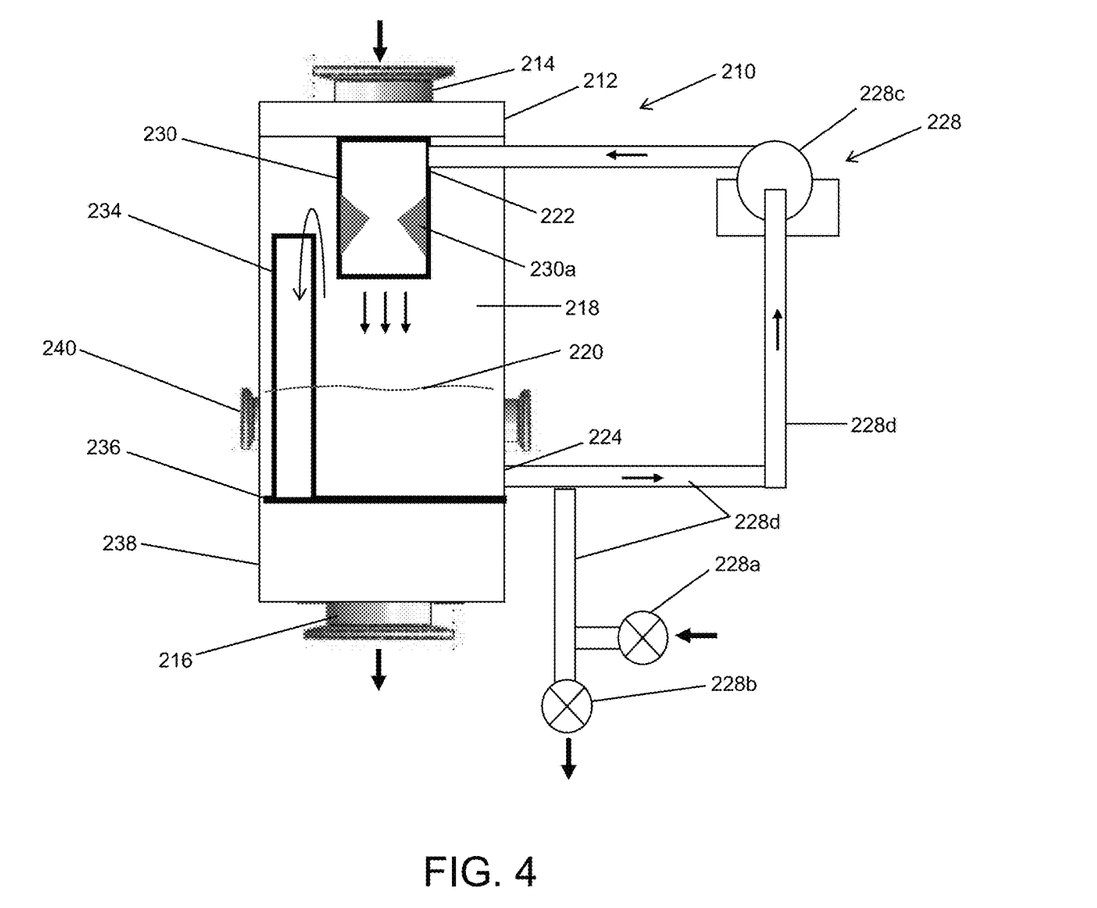
FIG. 4. is a schematic drawing of a third embodiment of a liquid filter apparatus for separating solid from a semiconductor process gas.

Referring to FIG. 4, the numeral 210 generally designates another or third embodiment of a liquid filter apparatus that can be placed in the fore-line with a semiconductor process chamber exhaust and is configured to filter solids or particles from the semiconductor process gas, which is exhausted from the semiconductor process chamber. Similar to the previous embodiment, filter apparatus 210 includes a housing 212 with a process gas inlet 214 for receiving the semiconductor process gas inflow from a semiconductor processing chamber, which is typically laden with solids or particles, and a gas outlet 216, which discharges the filtered process gas after the filtering process described above. For details of the suitable materials for the housing construction reference is made to the first embodiment.

As best seen in FIG. 4, housing 212 also includes a filter chamber 218 that receives the process gas through process gas inlet 214 and from which the filtered gas is discharged through gas outlet 216. Filter chamber 218 forms a liquid reservoir 220 to hold a filter liquid that filters solids or particles from the process gas flowing into the filter apparatus. For examples of suitable liquid characteristics and suitable liquids that can filter solids or particles from semiconductor process gases, reference is made to the first embodiment.

In the illustrated embodiment, process gas inlet 214 and gas outlet 216 are generally in line similar to the second embodiment. To that end, housing 220 also includes an exhaust chamber 238 between liquid reservoir 220 and gas outlet 216 to allow the filter gas to be exhausted from the filter chamber internally prior to being discharged through gas outlet 216. For further details of exhaust chamber 238 reference is made to the previous embodiment.

Similar to the previous embodiment, housing 210 includes a feed tube 230 that is in fluid communication with inlet 214 but extends into chamber 218 and optionally terminates above the filter fluid. Tube 230 is also formed from an inert material, such as aluminum, quartz, polymers and typically a stainless steel alloy In the illustrated embodiment, tube 230 includes a restriction 230a to form a venturi tube and an inlet 222 for the filter fluid to flow into the tube 230 and to generate the pressure differential to draw in the process gas into tube 230 through inlet 214 where it mixes with the filter liquid and thereafter is discharged into the filter chamber 218 via tube 230. The filter liquid is also discharged into the liquid reservoir 220 from tube 230.

In a similar manner as described above, the filter fluid may be circulated through apparatus 210 by way of a fluid circuit 228 (e.g. controlled by a controller, such as described above, which includes, in addition to valves 228a and 228b, a pump 228c (such as a centrifugal or magnetically coupled pump), which circulates the filter fluid though apparatus 210 by way of various conduits 228d.

In the illustrated embodiment, as noted, the liquid inlet 222 is formed in the tube 230, while the liquid outlet 224 is located in the liquid reservoir beneath the liquid level.

Apparatus 210 operates in a similar manner to apparatus 110. Process gases flows into inlet 214 but whose flow is enhanced by the venturi effect of the filter liquid flowing through tube 230. The process gas mixes with the filter liquid and is then filtered and injected into the filter chamber 218 via feed tube 230. The filtered gas is then exhausted from the filter chamber 218 through internal conduit 234, which directs the filtered gas into exhaust chamber 238, which then discharges the filtered gas through gas outlet 216.

In a similar manner to the previous embodiment, the filter liquid may be circulated through the apparatus 210 via a fluid circuit 228, which as noted includes an inlet valve 228a (which is in fluid communication with liquid inlet 222), an outlet valve 228b (which in fluid communication with liquid inlet 224), and various conduits to direct the flow of filter liquid trough apparatus 210. Fluid circuit 228 may also be configured to replace the filter liquid after a given time period or after the filter liquid has reached a desired level of particle saturation, as described above.

Apparatus 210 may also include optical windows 240 for viewing the chamber 218, similar to the second embodiment.

In any of the embodiments, the control system may include one or more sensors (not shown in each embodiment), which may be used to detect the level of the filter liquid or measure the opacity (optical torpidity) or other characteristic of the liquid, which may be used to indicated that the liquid has reached a certain level of absorption. Or both types of sensors may be used—one measuring the filter liquid height and the other measuring the characteristic of the liquid. In either or both cases, the control system may be used to adjust the flow of filter fluid into and out of the apparatus based on the one or more sensors to accommodate the output of the semiconductor chamber and/or to optimize the filtering process. Or as described below, the filter fluid may be automatically adjusted.

Figure 5:
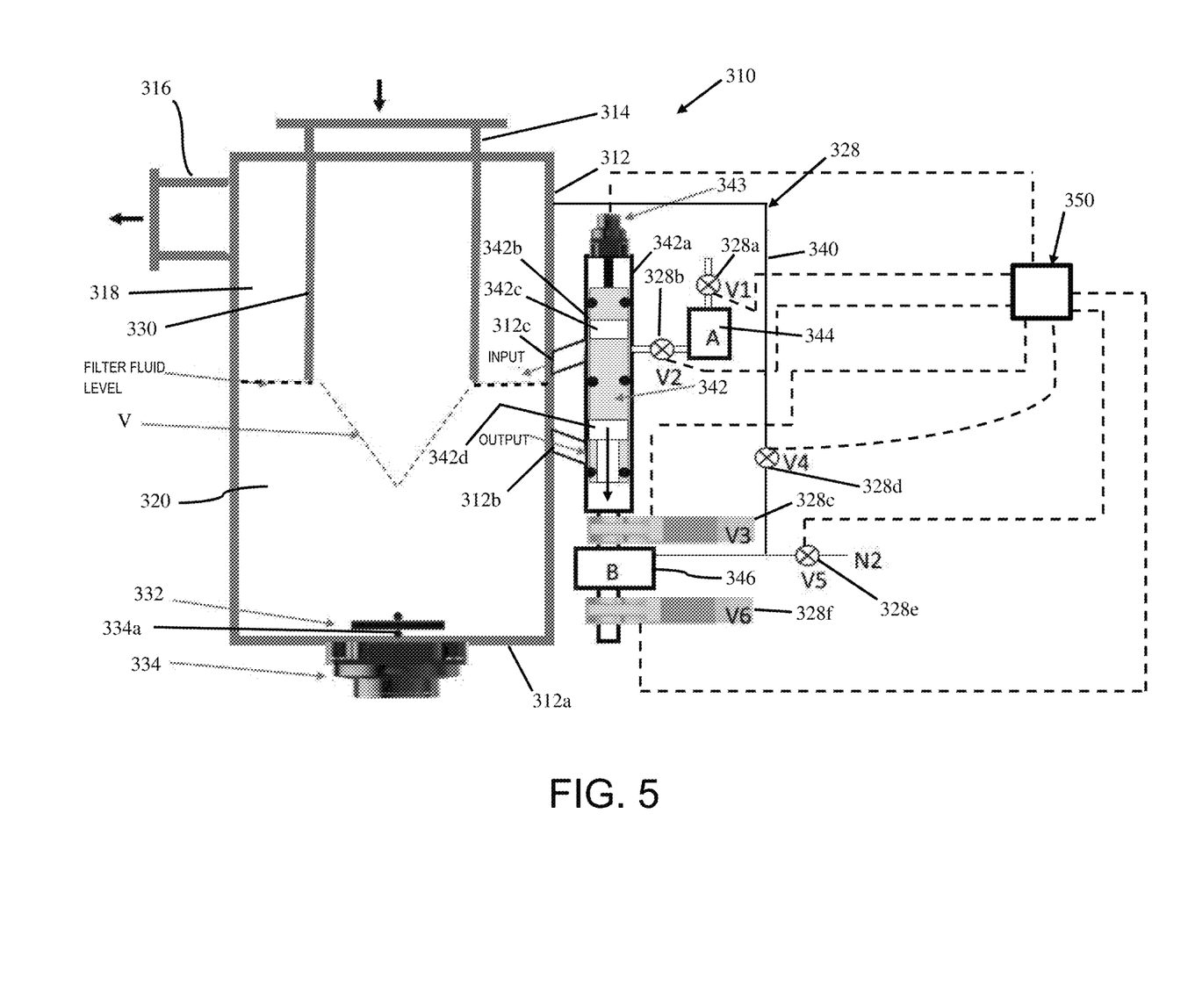
FIG. 5 is a schematic drawing of a fourth embodiment of a liquid filter apparatus for separating solid from a semiconductor process gas.

Referring to FIG. 5, the numeral 310 generally designates another or third embodiment of a liquid filter apparatus that can be placed in the fore-line between a semiconductor processing chamber and a processing pump (see FIGS. 6 and 7) and is configured to filter solids or particles from the semiconductor process gas, which is exhausted from the semiconductor process chamber. Further, as will be more fully described below, liquid filter apparatus 310 is configured to be in communication with a fluid circuit (328, described below) in an arrangement that allows for automatic fluid addition and removal of filter fluid to or from chamber (318) of the fluid apparatus.

Similar to the previous embodiment, filter apparatus 310 includes a housing 312, which forms a filter chamber 318, with a process gas inlet 314 for receiving the semiconductor process gas inflow from a semiconductor processing chamber into chamber 318 (see FIG. 6 for example, where filter apparatus 310 is mounted in the fore-line of the processing system, between the semiconductor chamber and the process pump), which is typically laden with solids or particles, and a gas outlet 316, which discharges the filtered process gas from chamber 318 after the filtering process described below. For details of the suitable materials for the housing construction reference is made to the first embodiment.

As best seen in FIG. 5, chamber 318 forms a liquid reservoir 320 to hold a filter liquid that filters solids or particles from the process gas flowing into the filter apparatus, and which is then discharged as waste. For examples of suitable liquid characteristics and suitable liquids that can filter solids or particles from semiconductor process gases, reference is made to the first embodiment. In the illustrated embodiment, process gas inlet 314 and gas outlet 316 are generally in line similar to the second embodiment with a right angle arrangement. Also similar to the previous embodiment, housing 310 includes a feed tube 330 that is in fluid communication with inlet 314 and that extends into chamber 318 and optionally terminates at or slightly below the filter fluid in liquid reservoir 320. Tube 330 is also formed from an inert material, such as aluminum, quartz, polymers and typically a stainless steel alloy.

In the illustrated embodiment, chamber 318 includes a rotating member 332, which is driven to rotate by a motor 334. Motor 334 is mounted external or outside of housing 312 but whose drive shaft 334a may extend through a sealed opening provided in housing wall 312a to engage rotating member 332 or may not penetrate the housing an instead couple to the rotating member via a magnetic coupling, as noted below. For example, the sealed opening may be formed by a sealed bushing or sealed grommet. The rotating member 332 may be in the form of multiple blades commonly mounted to an annular support, which is rotatably mounted at the bottom portion of housing wall 312a.

In one embodiment, drive shaft 334a of motor couples to rotating member 332 by a magnetic coupling through the wall of the housing 312. For example, shaft 334a may include a magnet, and rotating member 332 may also include a magnet, for example, mounted in or about the annular support to provide the magnetic coupling.

As noted above, rotating member 332 is located at the bottom portion of housing 312 in liquid reservoir 320 and, when rotated by motor 334, stirs or rotates the filter fluid in liquid reservoir 320, optionally in a continuous fashion. This fluid rotation enables the particles of varying densities to thoroughly mix with the filter fluid and thereafter is discharged from the filter chamber 318 via an outlet 312b formed in housing wall 312a. In addition, the rate of rotation will impact the discharge rate of the fluid from chamber via outlet 312b and the rate of inflow of the filter fluid into chamber 318 via an inlet 312c (also formed in housing wall 312a) from the fluid circuit described below. Further, the rate of rotation will determine the depth of the vortex V generated due to fluid rotation.

In a similar manner as described above, the filter fluid may be selectively and automatically circulated through apparatus 310 by way of a fluid circuit 328 (e.g. controlled by a controller, such as programmable logic controller, including microprocessor, such as described below).

In the illustrated embodiment, fluid circuit 328 includes a conduit 340, which is in fluid communication with the chamber 318 above the filter fluid, a sliding valve 342, and a plurality of control valves 328a (V1), 328b (V2), 328c (V3), 328d (V4), 328e (V5), and 328f (V6), which are opened and closed by a controller 350 (such as a microprocessor), to automatically control the flow of fluid through conduit 340 and through valve 342 based on a sequence of valve openings and closings described below. By providing fluid communication between chamber 318 (above the filter fluid) and conduit 340, conduit 340 is subject to the pressure in chamber 318, which is under a vacuum (or low or very low pressure) due to the fluid communication between the fore-line and chamber 318 through outlet 316. This vacuum (or low or very low pressure) is then extended to other parts of circuit 328, as described below. For example, conduit 340 may comprise a stainless steel tube.

As best seen in FIG. 5, sliding valve 342 includes a cylinder 342a and a sliding piston 342b, which is moved up and down cylinder 342a (as viewed in FIG. 5) by a motor 343, which is also controlled by controller 350 to open and close communication with the chamber 318 and circuit 328 through valve 342.

Additionally, circuit 328 includes two chambers 344 and 346, with chamber 344 in selective fluid communication with a make-up fluid supply via valve 328a (V1), and with chamber 346 in selective fluid communication with a supply of nitrogen gas via valve 328c (V3) and via valve with conduit 340. Thus, when valve 328a (V1) is opened, chamber 344 is filled with make-up fluid. Similarly, when valve 328e (V5) is opened, chamber 346 is filled with nitrogen. When valve 328e (V5) is closed, and valve 328d (V4) is open, the pressure in chamber 346 is then reduced to a low, very low or vacuum pressure.

To control the flow of fluid into and out of reservoir 320, cylinder 342a includes a first port (optionally formed by a conduit) in fluid communication with inlet 312c of housing 312 and a second port (optionally formed by a conduit) in fluid communication with outlet 312b of housing 312. Further, piston 342b includes two transverse passageways 342c and 342d, which when moved by motor 343 can align with the ports of the cylinder 342a to allow fluid communication between reservoir 320 and chamber 344 and/or chamber 346, depending on the open or closed state of valve 328b (V2) and valve 328c (V3). Valve 328b (V2) provides for selective fluid communication between chamber 344 and sliding valve 342 and reservoir 320 depending on the position of the piston 342b, and valve 328c (V3) provides for selective fluid communication between chamber 346 and sliding valve 342 and reservoir 320 depending on the position of the piston 342b.

Figure 5A:
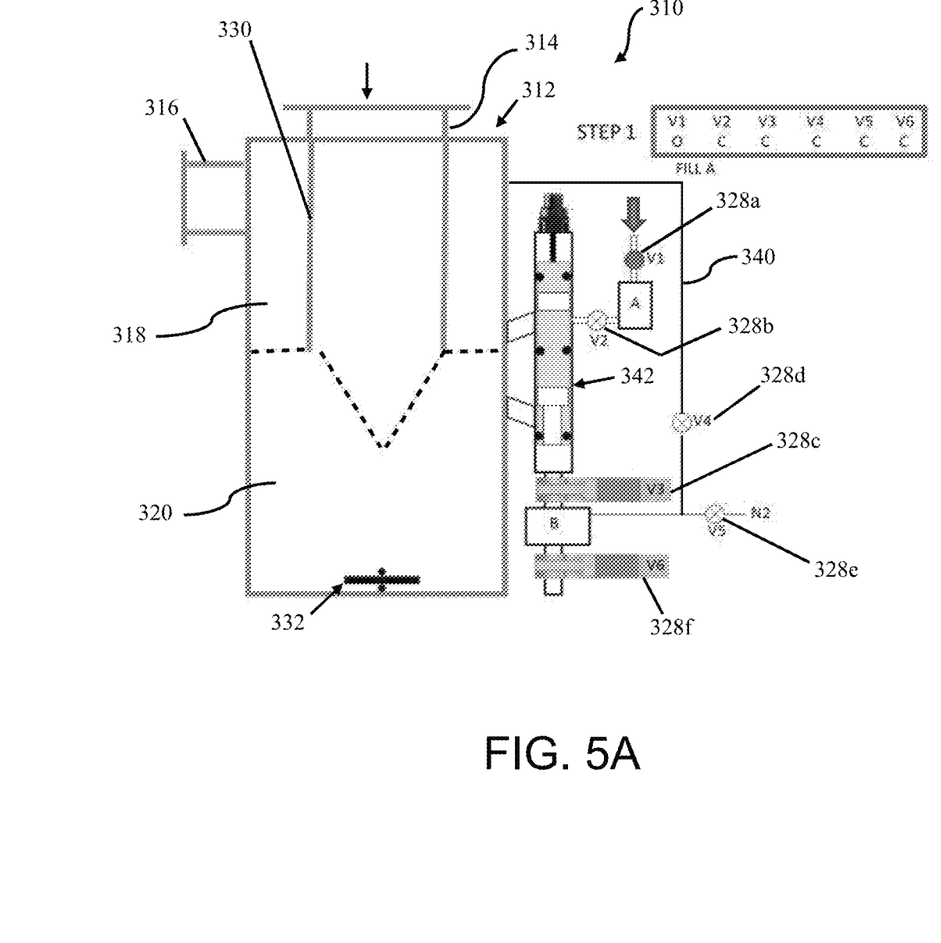
FIG. 5A is a similar view to FIG. 5 showing the sequence of valve openings.
Figure 5B:
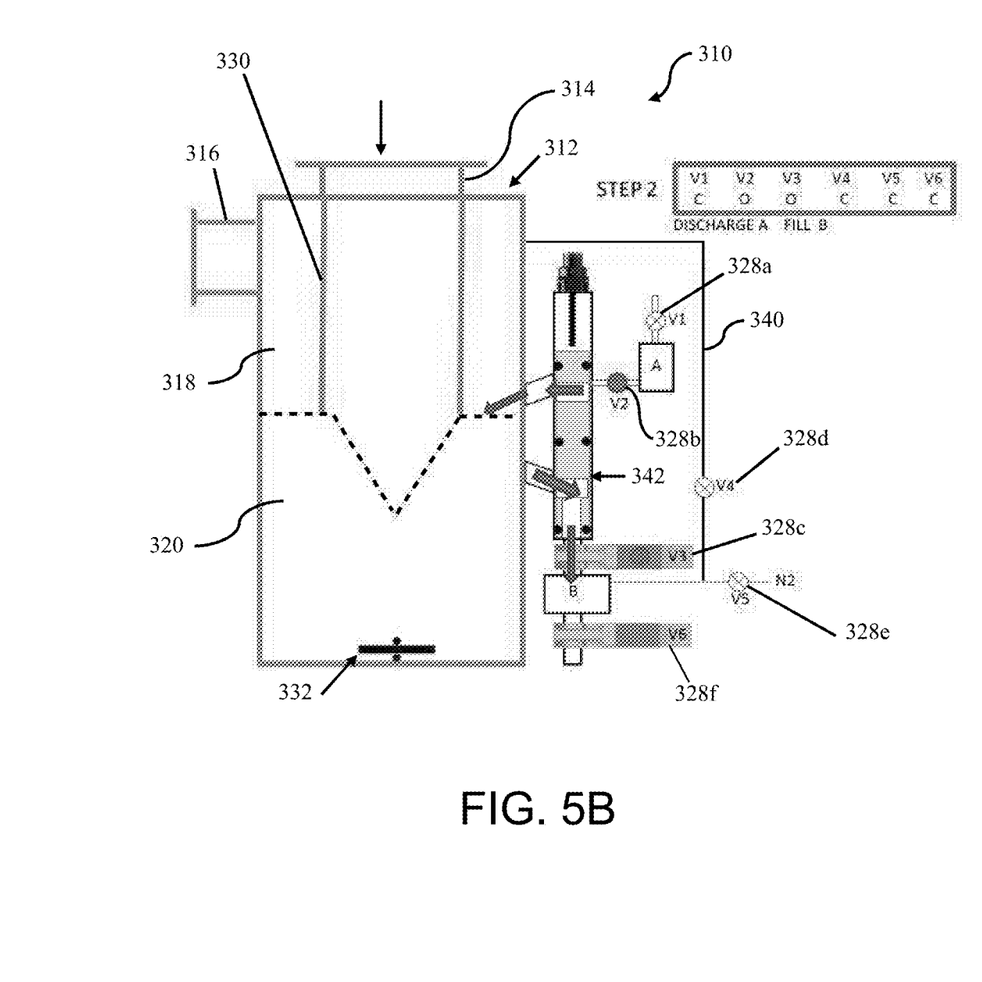
FIG. 5B is a similar view to FIG. 5 showing the sequence of valve openings.
Figure 5C:
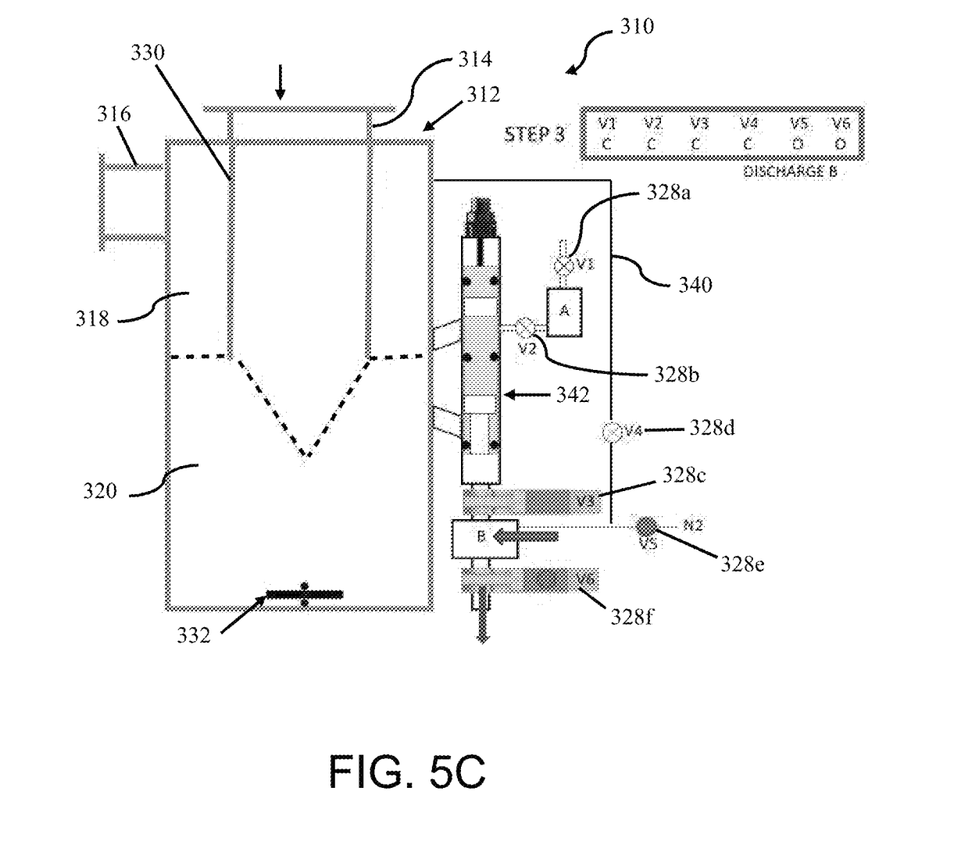
FIG. 5C is a similar view to FIG. 5 showing the sequence of valve openings.
Figure 5D:
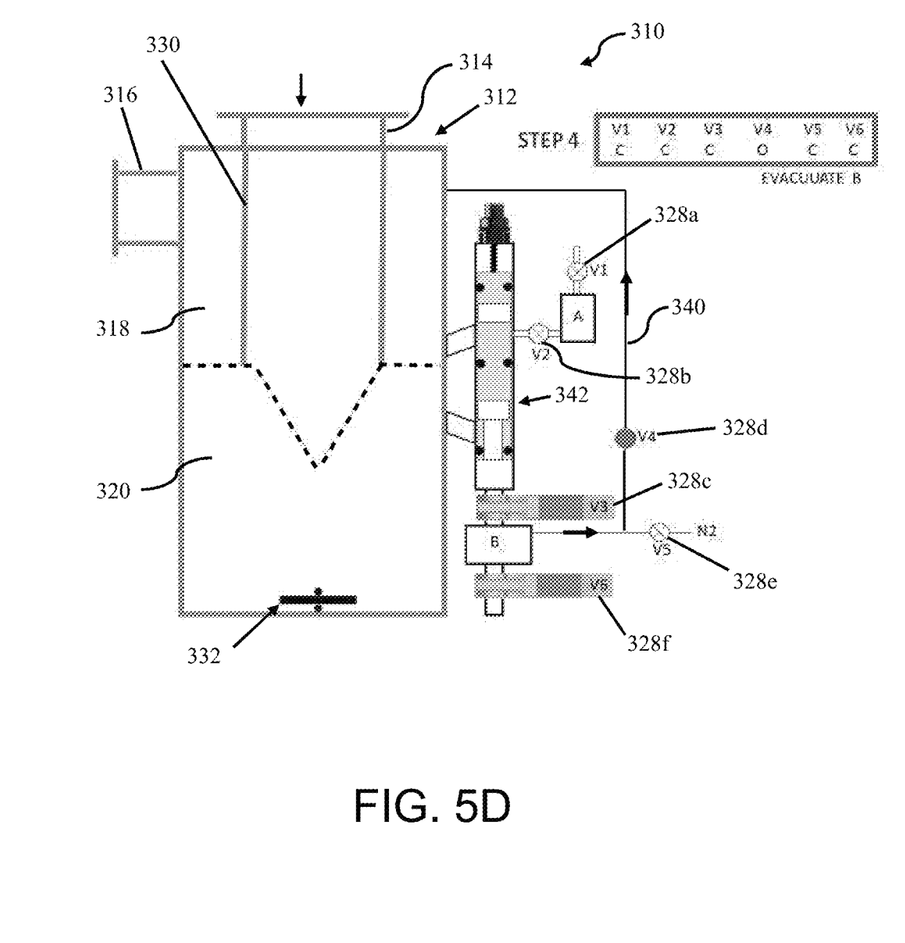
FIG. 5D is a similar view to FIG. 5 showing the sequence of valve openings.

As best understood from FIG. 5, when valve 328a (V1) is open and all the other valves (328b (V2), 328c (V3), 328d (V4), 328e (V5), and 328f (V6)) are closed (step 1, see FIG. 5A), make-up fluid is directed to chamber 344. When valve 328b (V2) and valve 328c (V3) are open and the rest of the valves (328a (V1), 328d (V4), 328e (V5), and 328f (V6)) are closed (step 2, see FIG. 5B) and motor 343 is driven to move the piston is in the lower position (as viewed in FIG. 5, where the transverse passageways 342c and 342d of piston 342b are aligned with the ports of the cylinder 342a), make-up fluid is sent to reservoir 320 and particle-filled fluid is discharged to chamber 346. When valves 328a (V1), 328b (V2), 328c (V3), and 328d (V4) are closed and valves 328f (V6) and 328e (V5) are opened (step 3, see FIG. 5C) then fluid is removed from chamber 346, driven by a pre-set nitrogen flow passing through the open valve 328e (V5). Once a given time is allowed so the fluid is removed from chamber 346, then valves 328a (V1), 328b (V2), 328c (V3), and 328e (V5), and 328f (V6) are closed and valve is 328d (V4) is opened to allow chamber 346 to evacuate so that the pressure in chamber 346 equilibrates with the fore-line pressure (step 4, see FIG. 5D). And the sequence is repeated by the controller. The timing of the sequence steps can vary because it is based the particular process and settings for the process. On average it is anticipated that the sequence timing could be cycling every 10 to 20 seconds depending on the particle loading of the fluid. If the semiconductor process effluent is of low particle loading the sequence could be up to 30 to 60 minutes.

Apparatus 310 operates in a similar manner to apparatus 110 in that process gases flows into inlet 314 but whose flow is then enhanced by the vortex effect of the filter liquid flowing around tube 330. The process gas mixes with the filter liquid and is then filtered after it is injected into the filter chamber 318 via feed tube 330. The filtered gas is then exhausted from the filter chamber 318 through gas outlet 316.

In the illustrated embodiment, the filter liquid is thus dynamically circulated through the apparatus 310 via fluid circuit 328.

Fluid circuit 328 may also be configured to replace the filter liquid after a given time period or after the filter liquid has reached a desired level of particle saturation, as described above.

Figure 6:
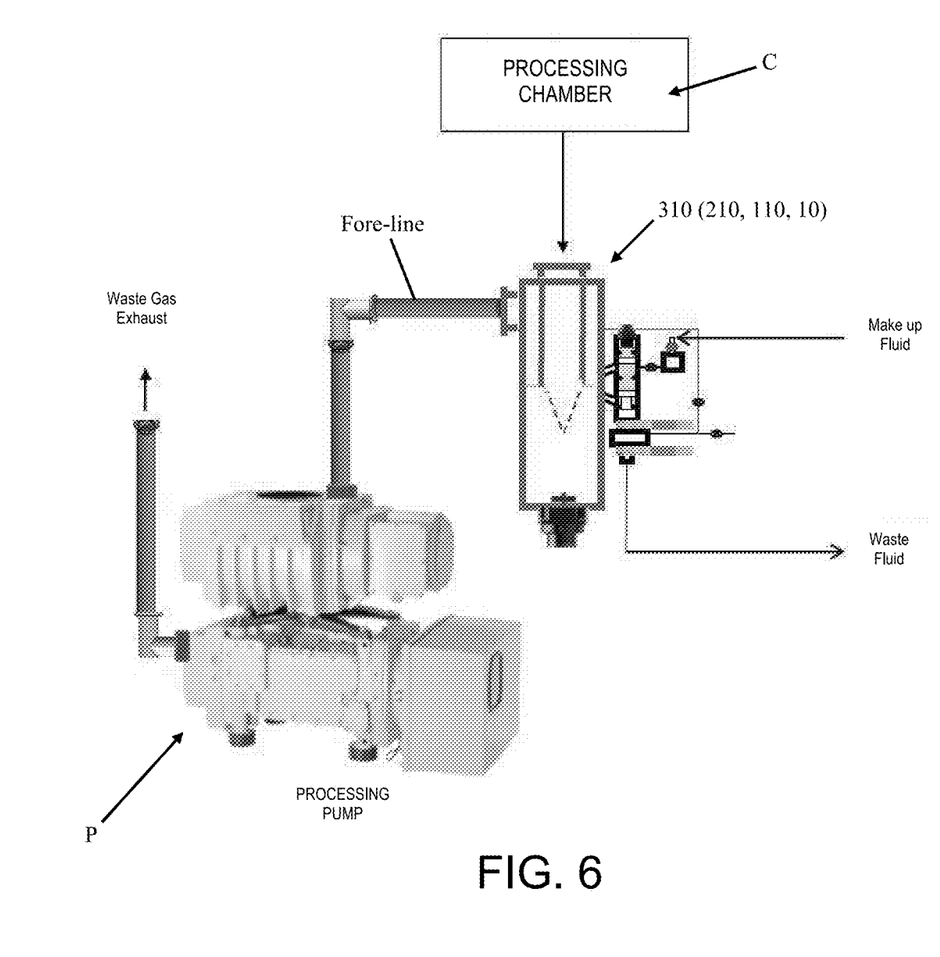
FIG. 6 is a schematic drawing of the fourth embodiment of the liquid filter apparatus illustrating the filter apparatus installed in a semiconductor processing system.
Figure 7:
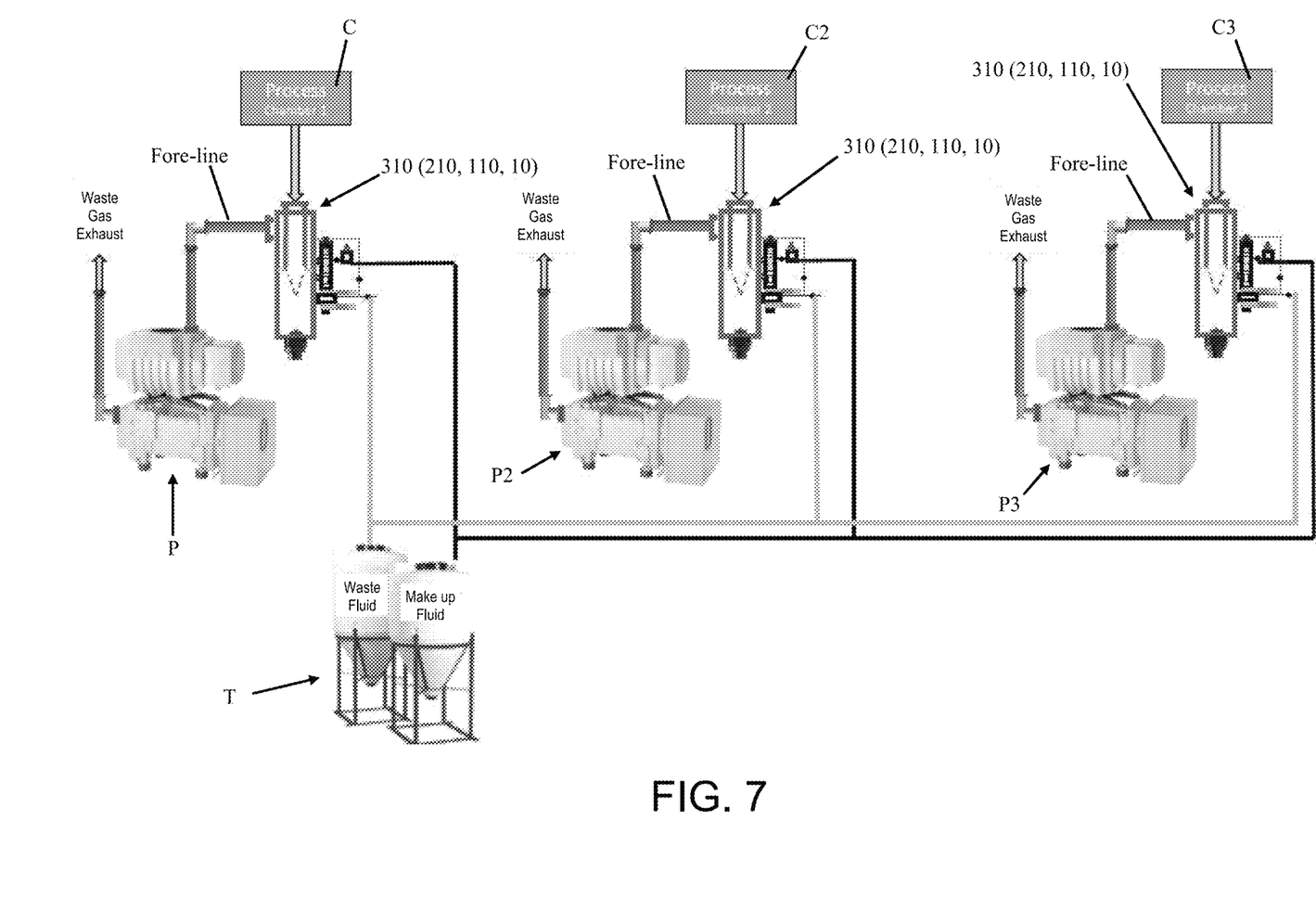
FIG. 7 is a schematic drawing of the fourth embodiment of the liquid filter apparatus illustrating the filter apparatus forming a multiple chamber installation for a semiconductor processing system.

Referring to FIGS. 6 and 7, filter apparatus 310 (or any of the other filter apparatuses 210, 110, or 10 described herein) may be installed in the fore-line between a semiconductor processing chamber C and a processing pump P, and further installed in a system with multiple chambers (C, C2, C3) and multiple pumps (P, P2, P3), with the waste fluid from each of the filter apparatuses optionally directed to a shared waste tank T, and optionally with the make-up fluid supplied from a shared make-up fluid supply tank T.

In any of the embodiments, the control system may include one or more sensors (not shown in each embodiment), which may be used to detect the level of the filter liquid or measure the opacity (optical torpidity) or other characteristic of the liquid, which may be used to indicated that the liquid has reached a certain level of absorption. Or both types of sensors may be used—one measuring the filter liquid height and the other measuring the characteristic of the liquid. In either or both cases, the control system may be used to adjust the flow of filter fluid into and out of the apparatus based on the one or more sensors to accommodate the output of the semiconductor chamber and/or to optimize the filtering process.

Both the right angle and the in-line filter apparatus configurations may be passive ("passive" means the reservoir has a fixed amount of filter fluid that is periodically manually change and replace with new filter fluid), i.e. they are inserted in line in a semiconductor processing system using the process gas pressure and flow characteristics of the semiconductor processing system or dynamic ("dynamic" means the particle laden filter fluid is dynamically/automatically removed and exchanged with fresh filter fluid, as described above in reference to FIG. 5). As noted, the filter liquids may be removed and added periodically through the valving and optionally pump based on predetermined maintenance periods. As noted, in one configuration, a filter liquid recirculating pump may be added to recirculate the filter liquid as shown in FIG. 4. In this embodiment, the recirculating filter liquid can have very high recirculating flow rate and may be mixed more efficiently using the venturi tube as shown and described. Using a venturi tube may achieve very high particle/gas separation and, as noted, creates a localized vacuum pull on the process gases entering the filter thus assisting the process vacuum pump operation and potentially reducing its total energy consumption.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

I claim:

1. A liquid filter apparatus for gas/solid separation for a semiconductor processing system, the semiconductor processing system including a semiconductor processing chamber and a vacuum pump, said filter apparatus comprising:
   a housing having a filter chamber, a semiconductor process gas inlet configured for fluid communication to a waste output of the semiconductor processing chamber, and a process gas outlet configured for fluid communication with the vacuum pump, said filter chamber forming a liquid reservoir, and said semiconductor process gas inlet and said process gas outlet in communication with said filter chamber wherein said filter chamber is under a vacuum, and wherein said housing includes a gas exhaust chamber;
   a filter liquid inlet and a filter liquid outlet in fluid communication with said liquid reservoir for delivering and removing filter fluid, respectively, to and from said liquid reservoir; and
   a feed tube, said feed tube being in communication with said semiconductor process gas inlet and extending into said liquid reservoir to directly inject a process gas flowing through said semiconductor process gas inlet into the filter fluid in the liquid reservoir,
   wherein said housing includes an internal conduit extending through the liquid reservoir in fluid communication with said filter chamber and said gas exhaust chamber to direct a flow of a filtered process gas from said filter chamber to said gas exhaust chamber.

2. The liquid filter apparatus according to claim 1, wherein said semiconductor process gas inlet is in line with said process gas outlet.

3. The liquid filter apparatus according to claim 2, wherein said gas exhaust chamber is between said liquid reservoir and said process gas outlet.

4. The liquid filter apparatus according to claim 1, wherein said feed tube comprises a perforated feed tube.

5. The liquid filter apparatus according to claim 4, wherein said perforated feed tube includes a distal end portion and a plurality of perforations at said distal end portion.

6. The liquid filter apparatus according to claim 5, further comprising a filter liquid control system for controlling filter fluid flow into and out of said liquid reservoir.

7. The liquid filter apparatus according to claim 6, wherein said filter liquid control system comprises a controller and a fluid circuit, said controller controlling said fluid circuit to regulate filter fluid flow into and out of said liquid reservoir and configured to maintain the filter fluid at a liquid height in said liquid reservoir.

8. The liquid filter apparatus according to claim 1, further comprising a filter liquid control system for controlling filter fluid flow into and out of said liquid reservoir wherein said filter liquid control system includes a pump to pump the filter fluid into said liquid reservoir.

9. The liquid filter apparatus according to claim 8, said filter liquid inlet being in fluid communication with said liquid reservoir through said feed tube wherein said pump is configured to circulate the filter fluid into said liquid reservoir through said feed tube.

10. The liquid filter apparatus according to claim 1, wherein said filter fluid comprises a perfluoropolyether (PFPE).

11. A method of separating solids from a semiconductor process gas, said method comprising the steps of:
   providing a liquid filter apparatus according to claim 1, wherein the filter fluid has a vapor pressure below $10^{-7}$ Torr;
   maintaining the filter fluid under a vacuum associated with the vacuum pump;
   directing the semiconductor process gas into the filter fluid in the liquid reservoir though the feed tube to thereby filter the semiconductor process gas; and
   exhausting a filtered semiconductor process gas.

12. The method according to claim 11, wherein said directing includes bubbling the semiconductor process gas into the filter fluid in the liquid reservoir.

13. The method according to claim 11, further comprising circulating filter fluid through said liquid reservoir to thereby remove spent filter fluid.

14. The method according to claim 11, wherein said filter fluid comprises a perfluoropolyether (PFPE).

* * * * *

UNITED STATES PATENT AND TRADEMARK OFFICE
CERTIFICATE OF CORRECTION

PATENT NO. : 11,786,858 B2
APPLICATION NO. : 16/893504
DATED : October 17, 2023
INVENTOR(S) : Imad Mahawili Page 1 of 1

It is certified that error appears in the above-identified patent and that said Letters Patent is hereby corrected as shown below:

In the Specification

Column 1
Line 6, "Jun. 6, 2020" should be --Jun. 6, 2019--

Signed and Sealed this
Sixteenth Day of April, 2024

Katherine Kelly Vidal
*Director of the United States Patent and Trademark Office*